(12) United States Patent
Holp et al.

(10) Patent No.: US 10,886,191 B2
(45) Date of Patent: Jan. 5, 2021

(54) HEAT TRANSFER PLATE

(71) Applicant: Robert Bosch GmbH, Stuttgart (DE)

(72) Inventors: Reiner Holp, Winterlingen (DE); Adolf Dillmann, Muensingen (DE); Stefan Huehner, Kusterdingen (DE)

(73) Assignee: Robert Bosch GmbH, Stuttgart (DE)

(*) Notice: Subject to any disclaimer, the term of this patent is extended or adjusted under 35 U.S.C. 154(b) by 183 days.

(21) Appl. No.: 15/549,616

(22) PCT Filed: Dec. 11, 2015

(86) PCT No.: PCT/EP2015/079383
§ 371 (c)(1),
(2) Date: Aug. 8, 2017

(87) PCT Pub. No.: WO2016/128094
PCT Pub. Date: Aug. 18, 2016

(65) Prior Publication Data
US 2018/0033713 A1    Feb. 1, 2018

(30) Foreign Application Priority Data
Feb. 10, 2015   (DE) .................. 10 2015 202 300

(51) Int. Cl.
*H01L 23/367*    (2006.01)
*H01L 23/373*    (2006.01)
(Continued)

(52) U.S. Cl.
CPC ........... *H01L 23/367* (2013.01); *F28F 3/044* (2013.01); *H01L 23/3675* (2013.01);
(Continued)

(58) Field of Classification Search
CPC .............. H01L 23/367; H01L 23/3736; H01L 23/4006; F28F 3/044; F28F 2275/12
See application file for complete search history.

(56) References Cited

U.S. PATENT DOCUMENTS

| 4,563,725 A | 1/1986 | Kirby |
| 2005/0017350 A1 | 1/2005 | Corti et al. |

(Continued)

FOREIGN PATENT DOCUMENTS

EP    1901350    3/2008

OTHER PUBLICATIONS

International Search Report for Application No. PCT/EP2015/079383 dated Mar. 10, 2016 (English Translation, 3 pages).

*Primary Examiner* — David P Bryant
*Assistant Examiner* — Nirvana Deonauth
(74) *Attorney, Agent, or Firm* — Michael Best & Friedrich LLP

(57) ABSTRACT

The invention relates to a method for producing an assembly (1), in particular a power electronics unit, comprising the following steps: providing a component (2) to be cooled having a first surface (4), providing a cooling device (3) having a second surface (5) opposite the first surface (4), arranging a 3-dimensional heat transfer plate (6) between the two surfaces (4, 5), wherein the heat transfer plate (6) extends in a plate plane (11) parallel to the two surfaces (4, 5) and in the initial state a plurality of contact extensions (9) which extend outwards with respect to said plate plane (11), and bracing the component (2) and the cooling device (3) relative to one another, such that the contact extensions (9) are deformed in the direction of the metal sheet.

8 Claims, 5 Drawing Sheets

(51) Int. Cl.
*H01L 23/40* (2006.01)
*H01L 23/42* (2006.01)
*F28F 3/04* (2006.01)

(52) U.S. Cl.
CPC ...... *H01L 23/3736* (2013.01); *H01L 23/4006* (2013.01); *H01L 23/42* (2013.01); *F28F 2275/12* (2013.01)

(56) References Cited

U.S. PATENT DOCUMENTS

| | | | |
|---|---|---|---|
| 2007/0047209 A1* | 3/2007 | Thompson | H01L 23/433 361/710 |
| 2008/0290504 A1* | 11/2008 | Karavakis | H01L 23/3737 257/713 |
| 2009/0315173 A1 | 12/2009 | Kempers et al. | |
| 2012/0080799 A1 | 4/2012 | Hohlfeld et al. | |

* cited by examiner

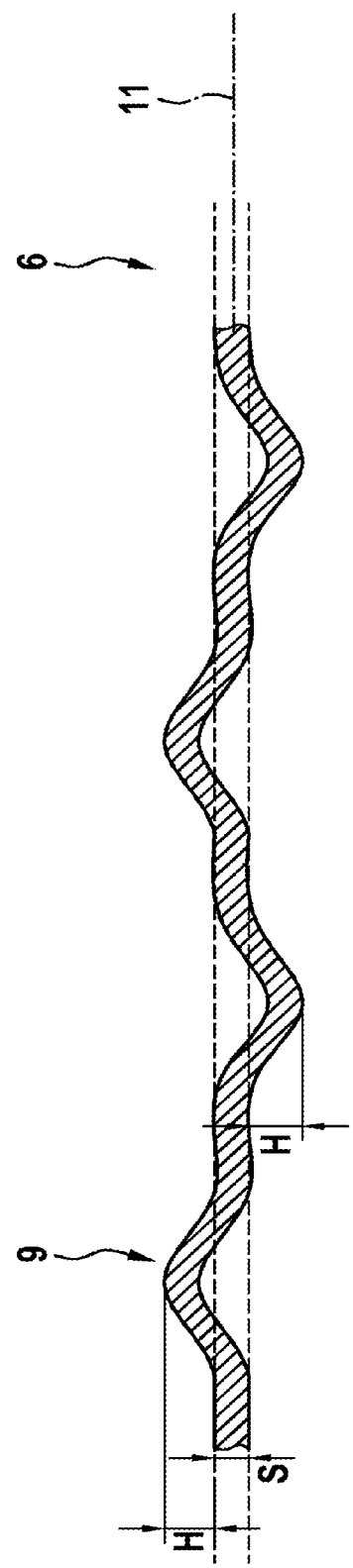

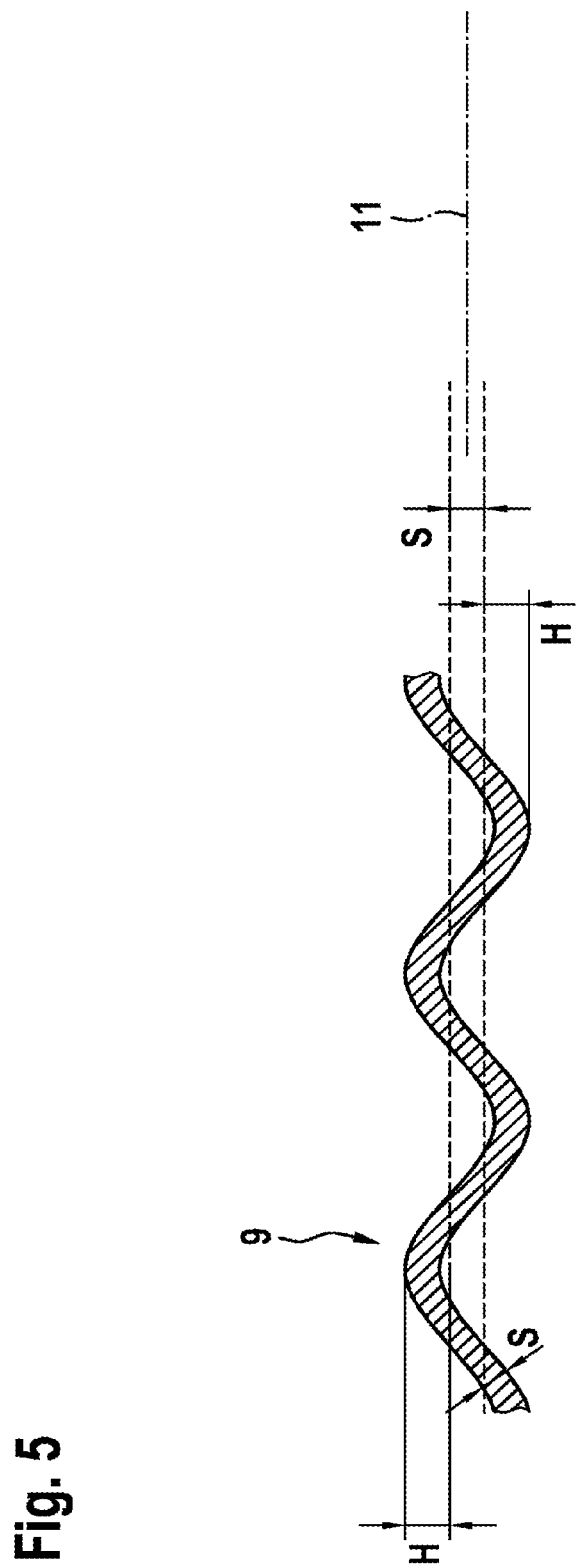

HEAT TRANSFER PLATE

BACKGROUND OF THE INVENTION

The present invention relates to a heat transfer plate and a method for producing an assembly, in particular an electronic power unit, having the heat transfer plate. Moreover, the invention relates to an assembly having the heat transfer plate.

In the case of an electronic power unit, heat conducting sheets, heat conducting pastes, laminates or solder pastes are used for transferring heat between cooling devices (cooling bodies) and the components that have become warm (for example power transistors). Such materials are necessary so as to compensate for tolerances and unevenness between the partners that are to be connected and simultaneously to achieve a good thermal connection. The thermal resistance is a combination of the two contact resistances of the surfaces that are to be thermally contacted and the thermal resistance of the heat conducting medium. The thermal resistance of the heat conducting medium is in turn dependent upon the thermal conductivity, the spacing (layer thickness) and the surface of the partner that is to be contacted. Thus, the thermal conductivity of heat conducting sheets or heat conducting pastes is in the range of 0.3 to 5 W/mK. The thermal conductivity of solder after hardening is in the range of 20 to 50 W/mK. Usual layer thicknesses are in this case in the range from 50 μm to 1,000 μm. The thermal contact resistances are dependent upon the microscopic characteristic of the partner surfaces (roughness, hardness, cleanliness, etc.) and also upon how the heat conducting medium makes contact with the surfaces (ductility, contact pressure, etc.).

SUMMARY OF THE INVENTION

The invention illustrates an option of using a 3-dimensional heat transfer plate in lieu of conventional heat conducting sheets or heat conducting pastes. This heat transfer plate offers the option, in particular in the case of an electronic power unit, of dissipating the heat that is produced to a cooling device in an effective manner. The heat transfer plate is used in particular on a power module of an electronic power unit in electric vehicles, hybrid vehicles, photovoltaic installations and wind turbine installations. These power modules change for example in the vehicle between the AC current of the electric drive and the DC current of the battery. In so doing, waste heat is produced for example in the region of 2 kW. Simultaneously, these power modules are constructed in a relatively small size (by way of example 50×50 mm) so that it is necessary to transfer the waste heat over a relatively small surface area to the cooling device.

Thus, a method is provided in accordance with the invention for producing an assembly. This assembly is in particular an electronic power unit. The method comprises the following steps:

(i) providing a component that is to be cooled and has a first surface, and (ii) providing a cooling device having a second surface that lies opposite the first surface.

(iii) A 3-dimensional heat transfer plate is arranged between the two surfaces.

The 3-dimensional structure of this heat transfer plate is defined as follows:

The heat transfer plate extends in parallel with the surfaces of the component that is to be cooled and the surfaces of the cooling device in a so-called "plate plane". A multiplicity of contact protrusions extend out of this plate plane. These contact protrusions are by way of example the edges of apertures that have been stamped in the heat transfer plate. It is preferred that the contact protrusions extend at an angle of less than 90° from the plate plane. The heat transfer plate together with the contact protrusions is a one-piece deformed or primary shaped part.

In a fourth method step (iv), the component that is to be cooled and the cooling device are braced with respect to one another. In other words, the two components are subsequently pressed together, wherein the first surface and the second surface move towards one another. As a consequence, the contact protrusions are deformed in the direction of the plate plane. In the ideal case, the contact protrusions are pushed into the plate plane such a distance that a 2-dimensional plate remains between the two surfaces in the braced state and the entire surface of this 2-dimensional plate is in contact with the component that is to be cooled and the cooling device.

In the initial state, the contact protrusions can extend in both directions, in other words in the direction of the component that is to be cooled and in the direction of the cooling device, or only in one of the two directions. In accordance with the invention, a largest possible contact surface for transferring the heat from the component to the cooling device is achieved by virtue of deforming the 3-dimensional heat transfer plate. In so doing, it is particularly provided that heat conducting pastes, heat conducting sheets, solder pastes or similar are not used between the component and the cooling device. Thus, it is preferred that only the deformed 3-dimensional heat transfer plate is located between the first and second surface.

Moreover, the invention comprises the heat transfer plate. This heat transfer plate is preferably used for performing the method described above. The heat transfer plate comprises the already described 3-dimensional structure. In accordance with the invention, the heat transfer plate is embodied in such a manner so that the contact protrusions are deformed as a result of bracing the component and the cooling device with respect to one another in the direction of the plate plane so that a large as possible contact surface is produced for the transfer of heat.

Advantageous embodiments of the invention are explained hereinunder. These advantageous embodiments can be used both within the scope of the method in accordance with the invention and also within the scope of the heat transfer plate in accordance with the invention:

Thus, it is provided in an advantageous manner that the contact protrusions are produced by virtue of deforming the heat transfer plate. In so doing, a 2-dimensional plate is used and as a result of the deformation production method said 2-dimensional plate becomes a 3-dimensional plate. Within the scope of this invention, a "2-dimensional plate" is a planar sheet in the full knowledge that the sheet also extends in the third dimension owing to the thickness of its plate. In contrast, the "3-dimensional plate" in accordance with the invention comprises the multiplicity of contact protrusions that extend out of the plate plane and are deformed during the assembly procedure as far as possible in the plate plane.

So as to generate the contact protrusions, it is in particular provided that the heat transfer plate comprises a multiplicity of apertures. The edges of these apertures that are bent out of shape or deformed form the contact protrusions.

It is particularly preferred that the apertures are produced by means of deformation, by way of example stamping. In so doing, advantageously slot-shaped or star-shaped apertures are stamped and/or cut into the 2-dimensional plate so that the 3-dimensional heat transfer plate is produced. The edges and surfaces produced in this manner form the contact protrusions. By way of example, by means of alternately stamping two sides, contact protrusions are produced that extend both in the direction of the cooling device and also in the direction of the component that is to be cooled. Moreover, the following methods can be used to produce the contact protrusions: stamping-bending, cutting and bending, laser cutting and bending, electron beam cutting and bending, and/or water jet cutting and bending.

As an alternative to the apertures, the contact protrusions can also be formed by deformed elevations in the plate. These elevations are produced by way of example by means of drawing or embossing the 2-dimensional plate.

In so doing, it is also provided that different methods for producing contact protrusions are used for a heat transfer plate. Thus, one part of the contact protrusions can be formed by means of stamped apertures and another part of the contact protrusions can be formed by means of deformed the elevations.

An essential function of the contact protrusions is to form a large as possible contact surface and simultaneously compensate for evenness tolerances. It is particularly advantageous for compensating evenness tolerances to arrange as many as possible small contact protrusions on the plate. The preferred number of contact protrusions is defined in dependence upon a plate thickness S of the heat transfer plate since in the case of correspondingly thinner plates several small contact protrusions can be arranged in the smallest area.

When producing the heat transfer plate by means of deforming a 2-dimensional plate, S also corresponds to the plate thickness of the initial plate (2-dimensional plate).

The plate thickness S is in this case defined in millimeters (mm): it is advantageously provided that on one area of 10,000 $S^2$ at least 50, preferably at least 100, particularly preferably at least 200, contact protrusions are formed. In the case of a conventional plate thickness S of 0.1 mm, at least 50 to 200 contact protrusions are thus formed in an advantageous manner on a square centimeter (100 $mm^2$).

Furthermore, it is provided that the contact protrusions in the 3-dimensional heat transfer plate are significantly elevated. In particular, it is provided in so doing that the contact protrusions are elevated by at least 0.25 S, preferably by at least 0.5 S, particularly preferably by at least 1 S.

The plate thickness S comprises advantageously a lower limit of 0.05 mm, preferably 0.1 mm. The upper limit of the plate thickness S is advantageously 1 mm, preferably 0.5 mm. The plate thickness S of the heat transfer plate is advantageously selected in the range defined here between the lower limit and the upper limit, wherein the conflict of goals between the heat transfer plate being simple to produce and having optimal heat conducting characteristics in the assembly is taken into consideration.

As described, the heat transfer plate is advantageously produced by means of deforming a 2-dimensional plate. However, it is also preferably provided within the scope of the invention to produce 3-dimensional heat transfer plates using a primary shaping process, by way of example by means of sintering. Furthermore, it is preferably also provided to produce the 3-dimensional heat transfer plate by means of a material-removing process.

Copper or aluminum is advantageously used for the material of the heat transfer plate. It is preferably provided that the surface of the heat transfer plate or the entire heat transfer plate is produced from tin, silver or gold. In particular, with regard to selecting the material for the heat transfer plate, care is taken that the contact protrusions comprise a relevant elasticity so as to produce the greatest possible contact force on the surfaces of the component or the surfaces of the cooling device. At the same time, it is necessary to provide a ductile characteristic of the contact protrusions so that the contact protrusions can be sufficiently deformed.

The invention includes moreover an assembly, in particular an electronic power unit, comprising the component that is to be cooled having the first surface and the cooling device having the second surface, wherein the heat transfer plate, as described above, having deformed contact protrusions is arranged between the first surface and the second surface.

The subordinate claims, which are presented within the scope of the method in accordance with the invention or within the scope of the heat transfer plate in accordance with the invention, and the advantageous embodiments relate accordingly in an advantageous manner to the assembly in accordance with the invention.

BRIEF DESCRIPTION OF THE DRAWINGS

Exemplary embodiments of the invention are described in detail hereinunder with reference to the accompany drawing, in which:

FIG. 4 illustrates a heat transfer plate in accordance with the invention according to a second exemplary embodiment, and FIG. 5 illustrates a heat transfer plate in accordance with the invention according to a third exemplary embodiment.

DETAILED DESCRIPTION

Figure 1:
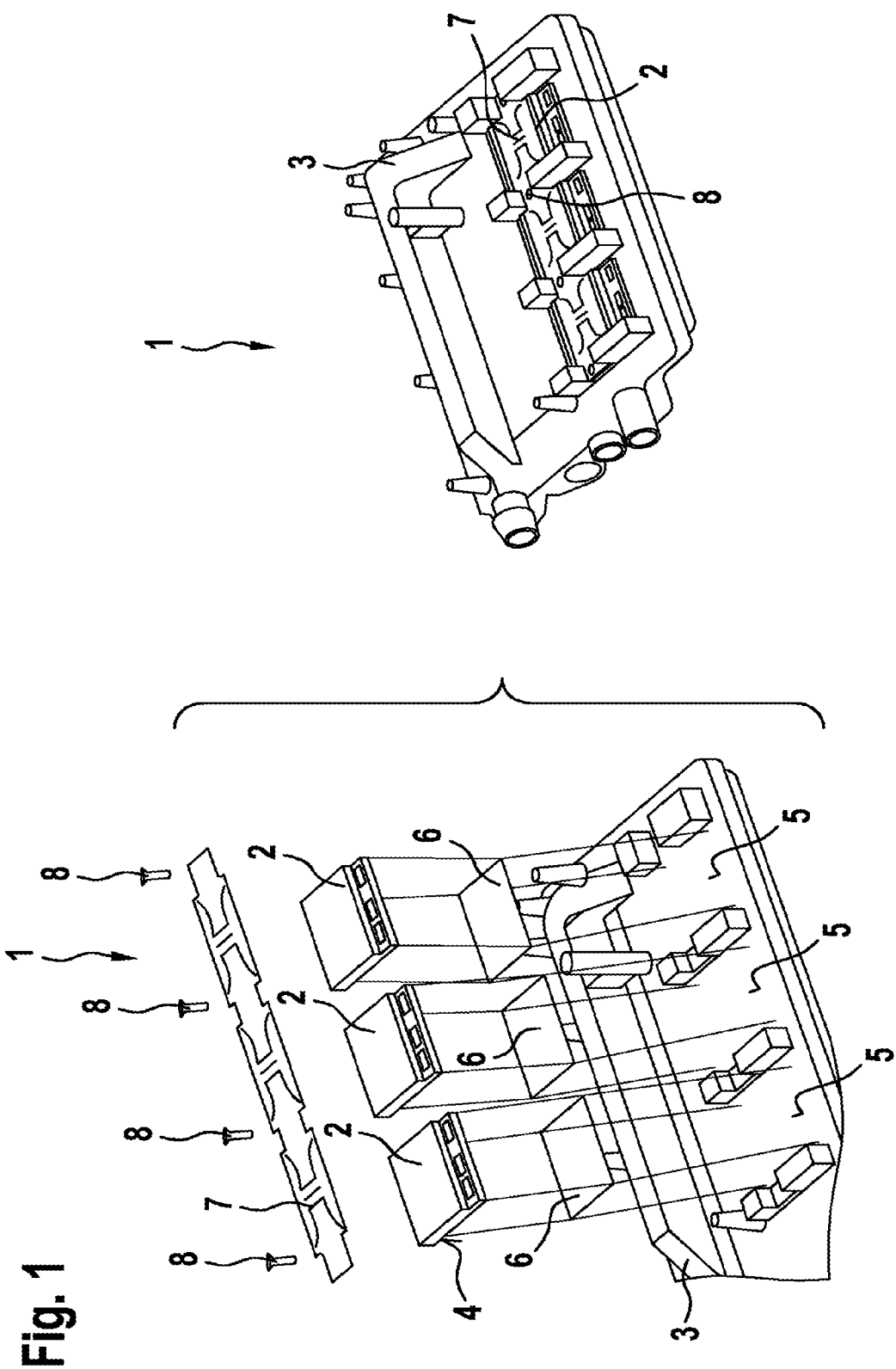
FIG. 1 illustrates a method in accordance with the invention for producing an assembly in accordance with the invention for all exemplary embodiments.

FIG. 1 illustrates hereinunder a method in accordance with the invention and also an assembly 1 in accordance with the invention for all exemplary embodiments. FIGS. 2 to 5 illustrate heat transfer plates 6 of different exemplary embodiments. Like components or like-functioning components are provided in all exemplary embodiments with identical reference numerals.

FIG. 1 illustrates the assembly 1 in an exploded view and an assembled view. The assembly 1 comprises components 2 that are to be cooled, a cooling device 3 and also a contact pressure spring 7 for fastening the components 2 that are to be cooled to the cooling device 3.

The components 2 that are to be cooled can also be described as power modules. These power modules are by way of example invertors for hybrid vehicles or electric vehicles, for photovoltaic installations or for wind power installations or converters.

The cooling device 3 is embodied by way of example from aluminum and comprises advantageous ducts in which cooling water flows.

In accordance with the illustration in FIG. 1, the respective component 2 that is to be cooled comprises a first surface 4 that faces the cooling device 3. A second surface 5 that lies opposite the first surface 4 is defined on the cooling device 3. One heat transfer plate 6 per component 2 is arranged between these two surfaces 4, 5. As is still to be described in detail, the heat transfer plates 6 comprise a 3-dimensional structure. During the procedure of assembling the assembly 1, the components 2 that are to be cooled are braced with respect to the cooling device 3 by means of the contact pressure spring 7. For this purpose, the contact pressure spring 7 is fastened to the cooling device 3 by means of screws 8 (or rivets).

As the components 2 are braced with respect to the cooling device 3, the 3-dimensional heat transfer plates 6 are deformed to the greatest extent possible and this renders it possible on the one hand to compensate for evenness tolerances between the two surfaces 4, 5 and also to produce a greatest possible contact surface for the transfer of heat. It is provided in particular that heat conducting pastes, heat conducting sheets inter alia are omitted between the two surfaces 4, 5.

Figure 2:
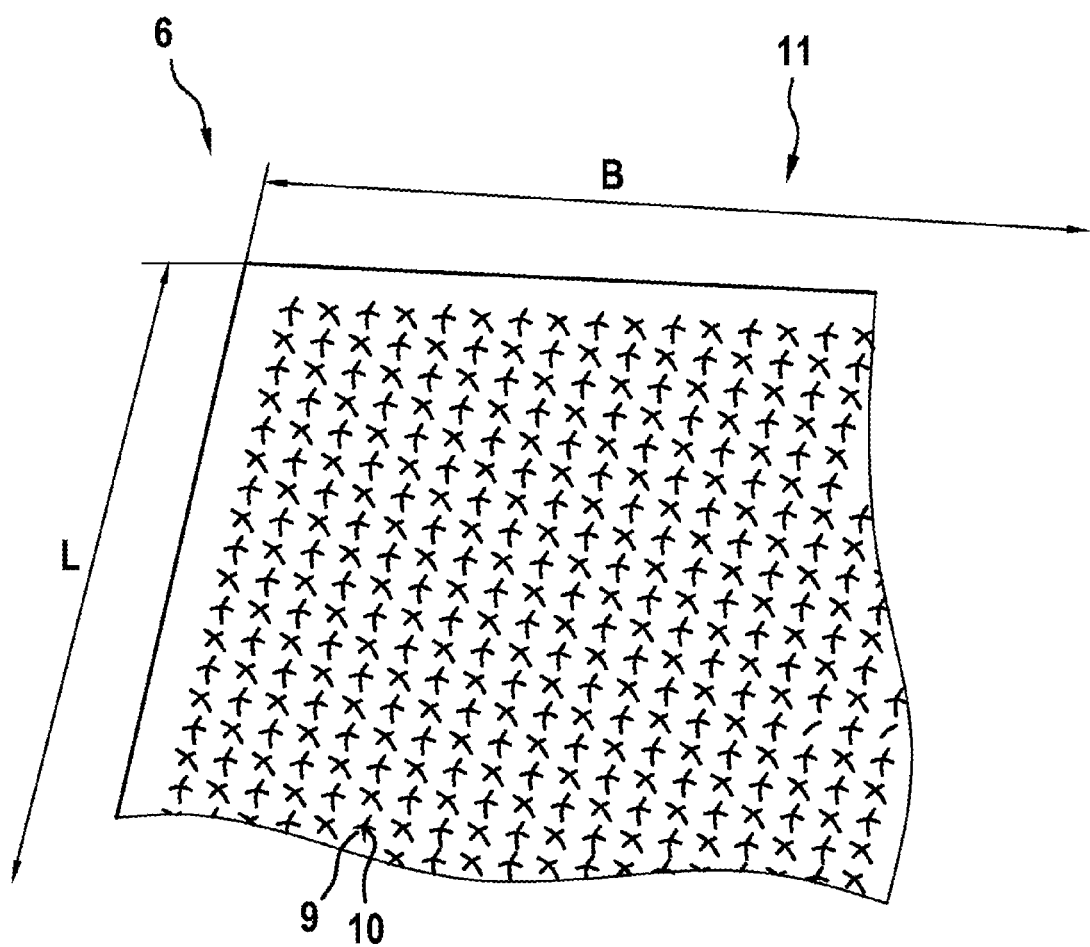
FIGS. 2 and 3 illustrate a heat transfer plate in accordance with the invention according to a first exemplary embodiment.

FIG. 2 illustrates a detail of the heat transfer plate 6 according to the first exemplary embodiment. The components 2 are by way of example 50 mm×50 mm in size. Accordingly, the heat transfer plate 6 comprises also approximately a width B of 50 mm and a length L of 50 mm. The width B and the length L of the heat transfer plate 6 define the so-called "plate plane 11". A multiplicity of contact protrusions 9, as are evident in FIG. 3, extend from the plate plane 11.

In the first exemplary embodiment, the contact protrusions 9 are formed by means of stamping an originally 2-dimensional plate. In so doing, star-shaped apertures 10 are stamped. The deformed edges of these apertures 10 form the contact protrusions 9. As a result of the star shape of the apertures 10, four triangular contact protrusions 9 are produced per aperture 10.

As an alternative to the illustrated exemplary embodiment, it is also possible to stamp in both directions so that the contact protrusions 9 would be elevated in both directions, by way of example in an alternating manner.

In lieu of the illustrated star-shaped apertures 10, it is also provided to stamp in this case any other random shape.

Figure 3:
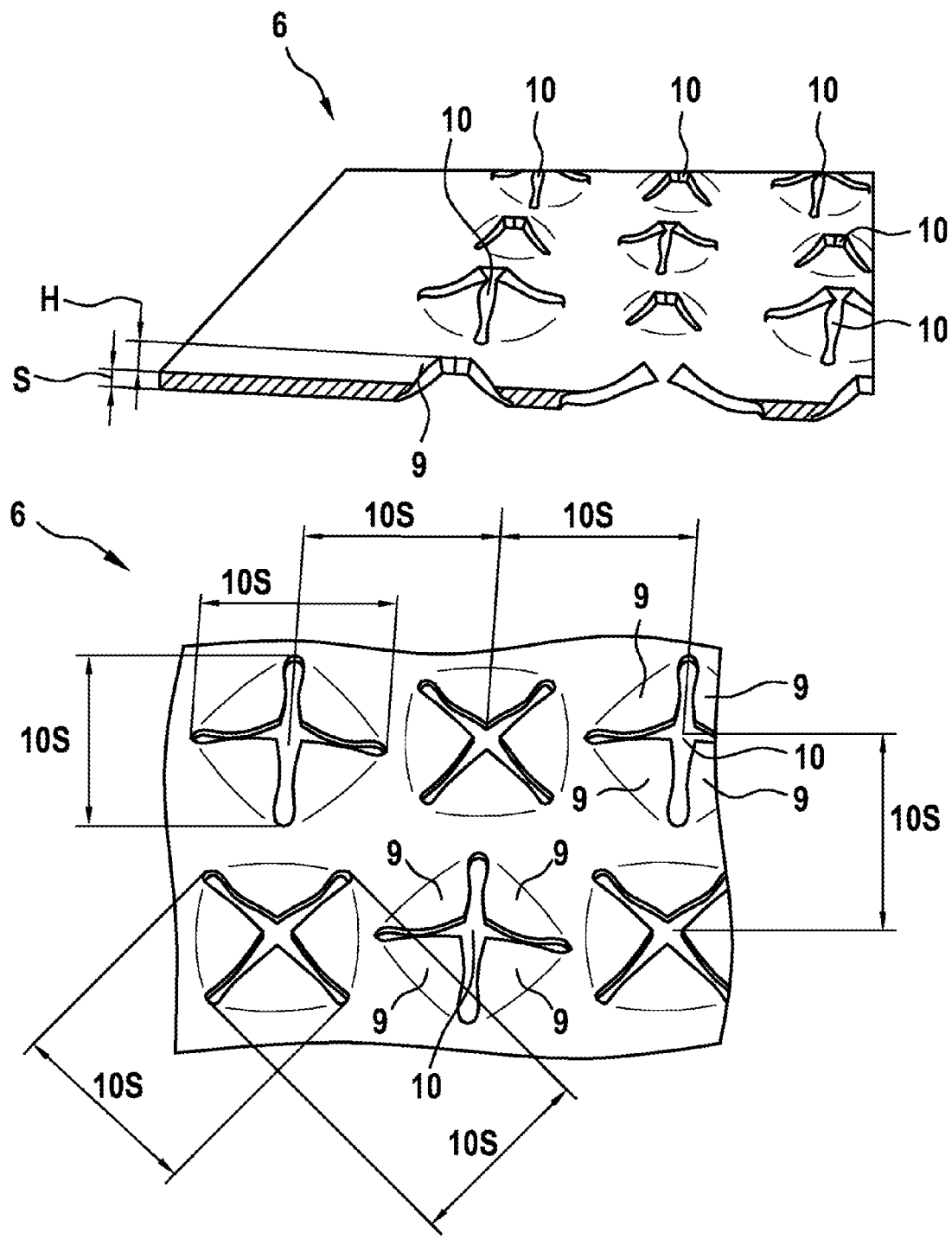

FIG. 3 illustrates how a height H is defined. The contact protrusions 9 are elevated to this height H. Moreover, FIG. 3 illustrates the plate thickness S of the originally 2-dimensional plate.

The stamped apertures 10 comprise in each case approximately a size of 10 S. By way of example in the case of a plate thickness S of 0.1 mm, the apertures 10 extend in each case on to an area of a square millimeter. By virtue of a smallest possible spacing between the apertures 10, it is possible to form as many contact protrusions 9 as possible in the smallest space.

FIG. 4 illustrates a section through the heat transfer plate 6 according to the second exemplary embodiment. In the second exemplary embodiment, the contact protrusions 9 are not formed in the plate by means of holes that have been stamped through but rather are formed by means of deformed elevations.

FIG. 5 illustrates the heat transfer plate 6 according to the third exemplary embodiment. In the third exemplary embodiment, the plate is curved in the shape of waves so that the contact protrusions 9 are formed by means of the wave hills and valleys.

The three exemplary embodiments illustrate only three examples of the geometric shape of the 3-dimensional heat transfer plate 6. However, the invention includes the most different geometric shapes of these heat transfer plates 6. In each case, it is crucial that the contact protrusions 9 extend out of the plate plane 11 and comprise corresponding material characteristics so as during the procedure of assembling the assembly said contact protrusions are correspondingly deformed between the two surfaces 4, 5.

The invention claimed is:

1. A method for producing an assembly (1), comprising the following steps:
   providing a component (2) that is to be cooled and has a first surface (4),
   providing a cooling device (3) having a second surface (5) that lies opposite the first surface (4),
   forming a 3-dimensional, one-piece heat transfer plate (6) that extends in a plate plane (11) and that has, in an initial state, a plurality of contact protrusions (9) that extend out of the plate plane (11), wherein the heat transfer plate (6) comprises a multiplicity of apertures (10), wherein edges of the apertures (10) form the contact protrusions (9), and wherein the apertures are x-shaped or star-shaped,
   arranging the 3-dimensional heat transfer plate (6) between the first and second surfaces (4, 5) so that the plate plane (11) is in parallel with the first and second surfaces (4, 5),
   bracing the component (2) and the cooling device (3) with respect to one another, as a consequence of which the contact protrusions (9) are deformed in the direction of the plate plane, and
   fastening a contact pressure spring (7) to the cooling device (3), such that the component (2) to be cooled is positioned between the contact pressure spring (7) and the heat transfer plate (6).

2. The method as claimed in claim 1, wherein the assembly (1) is an electronic power unit.

3. The method as claimed in claim 1, characterized in that the contact protrusions (9) are produced by deforming the heat transfer plate (6).

4. The method as claimed in claim 1, characterized in that the apertures (10) are produced by deformation.

5. The method as claimed in claim 3, characterized in that the contact protrusions (9) are re-shaped elevations.

6. The method as claimed in claim 1, characterized in that the apertures (10) are x-shaped.

7. The method as claimed in claim 1, characterized in that the apertures (10) are star-shaped.

8. The method of claim 1, wherein the component (2) to be cooled is a first component to be cooled and the heat transfer plate (6) is a first heat transfer plate, wherein the method further includes providing a second component (2) to be cooled and a second heat transfer plate (6), wherein the contact pressure spring (7) is fixed to the cooling device (3) such that the second component (2) to be cooled is positioned between the contact pressure spring (7) and the second heat transfer plate (6).

\* \* \* \* \*